US006733957B2

(12) United States Patent
Asanuma et al.

(10) Patent No.: US 6,733,957 B2
(45) Date of Patent: May 11, 2004

(54) DISK SUBSTRATE AND MANUFACTURING METHOD THEREFOR, AND DISK MANUFACTURED BY THE DISK SUBSTRATE

(75) Inventors: Toyohito Asanuma, Yokohama (JP); Kenichi Shimomai, Mito (JP)

(73) Assignee: Victor Company of Japan, Yokohama (JP)

( * ) Notice: Subject to any disclaimer, the term of this patent is extended or adjusted under 35 U.S.C. 154(b) by 174 days.

(21) Appl. No.: 10/026,699

(22) Filed: Dec. 27, 2001

(65) Prior Publication Data

US 2002/0090580 A1 Jul. 11, 2002

(30) Foreign Application Priority Data

Dec. 27, 2000 (JP) .......................................... 2000-397198

(51) Int. Cl.[7] ................................................ B44C 1/22
(52) U.S. Cl. ........................ 430/320; 430/321; 430/945; 369/275.4; 216/24
(58) Field of Search ..................... 430/270.13, 945, 430/321, 320; 369/275.4, 275.5; 216/24

(56) References Cited

U.S. PATENT DOCUMENTS

| 5,204,852 | A | * | 4/1993 | Nakagawa et al. | ......... 369/275.1 |
| 5,246,531 | A | * | 9/1993 | Junji et al. | ..................... 216/47 |
| 5,696,758 | A | * | 12/1997 | Yanagimachi et al. | ... 369/275.4 |
| 5,923,640 | A | * | 7/1999 | Takemura et al. | ....... 369/275.3 |
| 6,221,772 | B1 | * | 4/2001 | Yang et al. | ................... 438/689 |
| 6,392,350 | B1 | * | 5/2002 | Amano | ................... 315/111.21 |
| 6,404,713 | B1 | * | 6/2002 | Ueki | ......................... 369/47.53 |
| 6,510,129 | B1 | * | 1/2003 | Hirokane et al. | ......... 369/275.4 |
| 6,580,678 | B2 | * | 6/2003 | Kondo et al. | ............ 369/275.2 |

FOREIGN PATENT DOCUMENTS

| EP | 0467716 | * | 1/1992 |
| JP | 04-286736 | | 10/1992 |
| JP | 2000-82242 | | 3/2000 |
| JP | 2000-260069 | * | 9/2000 |

OTHER PUBLICATIONS

Machine translation of JP 2000–082242.*
J. Hirokane et al., "An Etched Glass Master and a Photomask for an Optical Disk Substrate", International Progress In Precision Engineering, 1993, pp. 542–553.

* cited by examiner

Primary Examiner—Martin Angebranndt
(74) Attorney, Agent, or Firm—Connolly, Bove, Lodge & Hutz LLP

(57) ABSTRACT

A method for manufacturing a disk substrate for mass production of a phase change optical disk, wherein an original disk substrate is having a resist layer (2) applied on a glass substrate (1), composed of the steps of forming a depression (pit "p1" and groove "g1") having a first and a second depth by cutting laser to be exposed on the surface of the resist layer (2), etching the depression having the first depth and the second depth from the surface of the resist layer (2) of the disk substrate in atmosphere mixed with Argon and Oxygen in ratio of 10 to 90% under gas pressure of 0.1 to 1.5 Pa, wherein the first and the second depth of the depression (pit "p1" and groove "g1") become predetermined value respectively, and ashing the resist layer (2) from the glass substrate (1).

8 Claims, 7 Drawing Sheets

DISK SUBSTRATE AND MANUFACTURING METHOD THEREFOR, AND DISK MANUFACTURED BY THE DISK SUBSTRATE

BACKGROUND OF THE INVENTION

1. Field of the Invention

The present invention relates to a manufacturing method of a disk substrate having a pit and a groove with different depth formed separately in the inner and outer circumference of the disk substrate, and relates to a disk substrate manufactured by the manufacturing method and a disk manufactured by the disk substrate.

2. Description of the Related Art

There existed various types of optical disks such as a read only type, a recordable type and a rewritable type. An optical disk, which is provided with a read only area and a recordable area enabling to be recorded by a user in one substrate, has been proposed and practiced. In an optical disk having a pit area to be a read only area and a groove area to be a recordable area, generally, a pit depth is set to $\lambda/4n$, which is the maximum amplitude of a sum signal of a reproduced signal, wherein "$\lambda$" is a wavelength of a laser beam for recording and reproducing and "n" is a refractive index of a substrate of the optical disk. On the other hand, a groove depth is set to $\lambda/8n$, which is the maximum amplitude of a differential signal of a tracking signal. In order to obtain such an optical disk substrate as being formed in one surface with a deep pit and a shallow groove, which are different in depth from each other, it is necessary for a pit and a groove to be varied in depth while forming a photoresist pattern as one process of manufacturing an optical disk master, which is a foundation of manufacturing the optical disk substrate.

Generally, in a process of forming such a photoresist pattern, there existed the method of changing each depth of pit and groove in one substrate such that using a laser beam in stronger intensity forms a pit and using a laser beam in weak intensity forms a groove. A depth of pit is determined by a film thickness of photoresist coated on a surface of substrate. However, a depth of groove depends on an intensity of laser beam and is apt to vary by a change of laser beam intensity or focus signal. A width of groove also depends on laser beam intensity, so that it is extremely hard to obtain an arbitrary width of groove. Further, a shape of groove obtained becomes approximately a V shaped one, so that a stable tracking signal can hardly be obtained. Furthermore, a recording power for recording a signal in a groove is necessary to be more powerful than that for recording in a conventional groove having a rectangular bottom, so that such a V shaped groove is a shape of unsuitable for recording in higher liner velocity.

In order to solve the problem mentioned above, there provided the prior arts such as a method of obtaining a pit and groove having a different depth from each other as mentioned above by using a photoresist pattern having a variety of depths as mentioned above and further by using the plasma etching and ashing processes.

SUMMARY OF THE INVENTION

Accordingly, in consideration of the above-mentioned problems of the related art, an object of the present invention is to provide a method for manufacturing a disk substrate for mass production of a phase change optical disk, wherein the disk substrate is provided with a pit having a first depth and a groove having a second depth allocated in an outer circumference area of the pit, the method including the steps of coating photoresist on a surface of a glass substrate (1) so as to form a resist layer (2) on the glass substrate (1), etching the surface of the resist layer (2) in atmosphere mixed with Argon and Oxygen in ratio of 10 to 90% under gas pressure of 0.1 to 1.5 Pa, wherein a pit (p1) having a first depth and a groove (g1) having a second depth are formed on the surface of the resist layer (2), forming a depression having a first and a second depth by cutting laser to be exposed on the surface of the resist layer (2), etching the depression having the first depth and the second depth from the surface of the resist layer of the disk substrate (1) in atmosphere mixed with Argon and Oxygen in voluminal ratio of 10 to 90% under gas pressure of 0.1 to 1.5 Pa, wherein the first and the second depth of the depression become predetermined value respectively, and ashing the resist layer (2) from the glass substrate (1).

Other object and further features of the present invention will be apparent from the following detailed description when lead-in conjunction with the accompanying drawings.

DETAILED DESCRIPTION OF THE PREFERRED EMBODIMENTS

Figure 1:
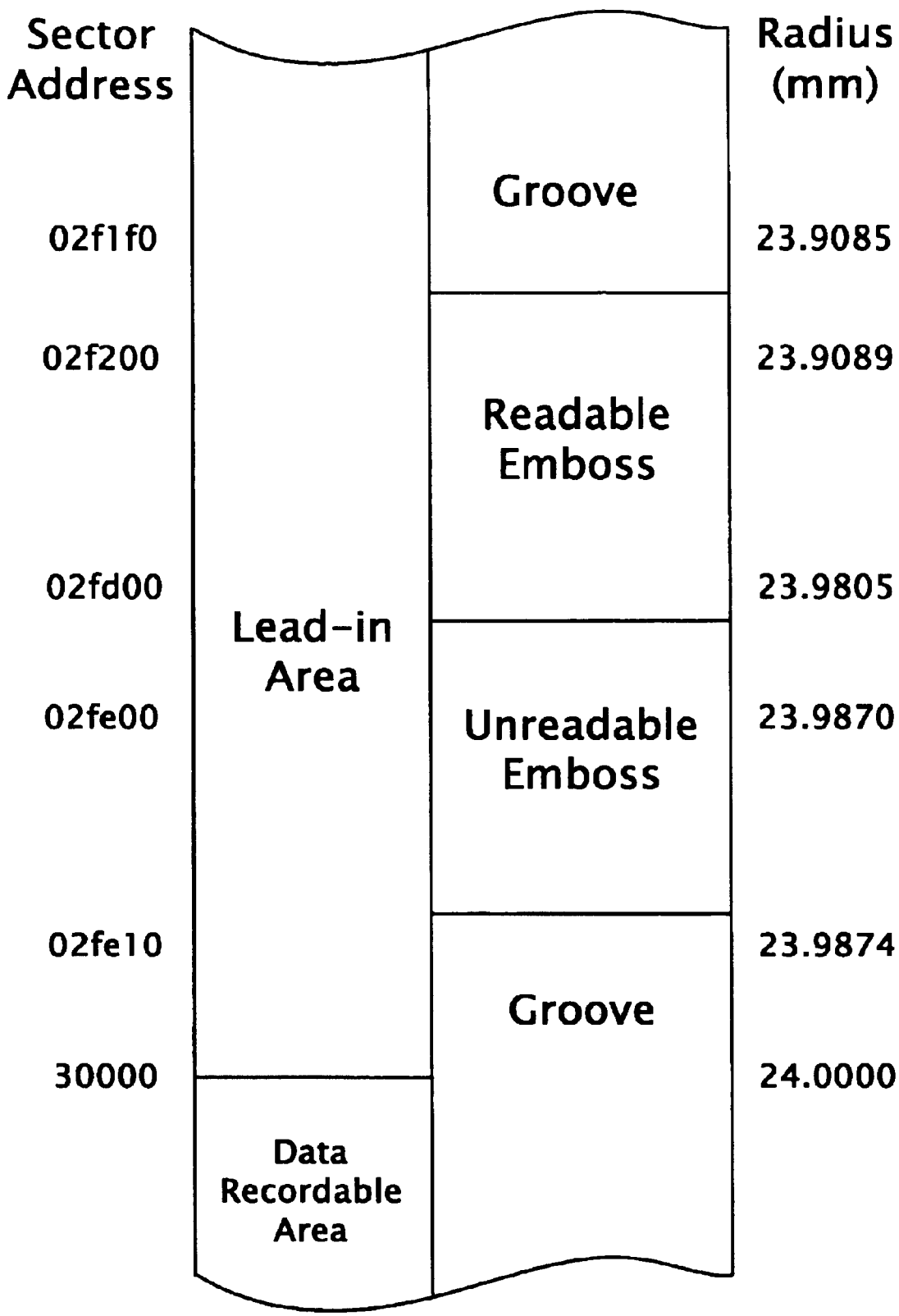
FIG. 1 is a diagram for explaining a pit forming area.

FIG. 1 is a diagram for explaining a pit forming area. A lead-in area not shown in FIG. 1 is an area having an end address 30000 before a groove portion, and the data area is the area after the groove portion having a start address of 30000 through a lead-out area. In FIG. 1, a Readable Emboss is an area of a disk radius of 23.9085 mm through 23.9805 mm, which start address is 02f200 and end address is 02fd00. The diameter of the disk is 120 mm.

A disk substrate of a recordable digital versatile disk (such as DVD-RW ver 1.1, hereinafter referred to as "DVD-RW") has a track pitch of 0.74 $\mu$m, a length of 0.4 $\mu$m for the shortest pitch, a thickness of 0.6 mm (1.2 mm for double-sided disk) and a diameter of 120 mm.

The Readable Emboss is recorded with information of copy protection in scramble format for CPRM (Content Protection for Recordable Media) such as secret code or encryption by digital watermark. The copy protection method using this CPRM can protect data (contents) recorded in the data area from unauthorized use or copying.

It is obvious that the type of copy protection information is not limited to CPRM but also include any other type of copyright protection that is adopted by the optical disk standard.

Theoretically, it is preferable for an optical disk having a pit "p1" of which depth is $\lambda/4n$ and a groove "g1" of which depth is $\lambda/8n$ wherein "$\lambda$" is a wavelength of a laser beam for recording and reproducing, "n" is a refractive index for the disk substrate. Accordingly, the disk substrate in accordance with the present invention can be applied for a recordable optical disk such as a magneto-optical type, a phase change type, or an organic dye type having a pit and a groove.

Figure 3:
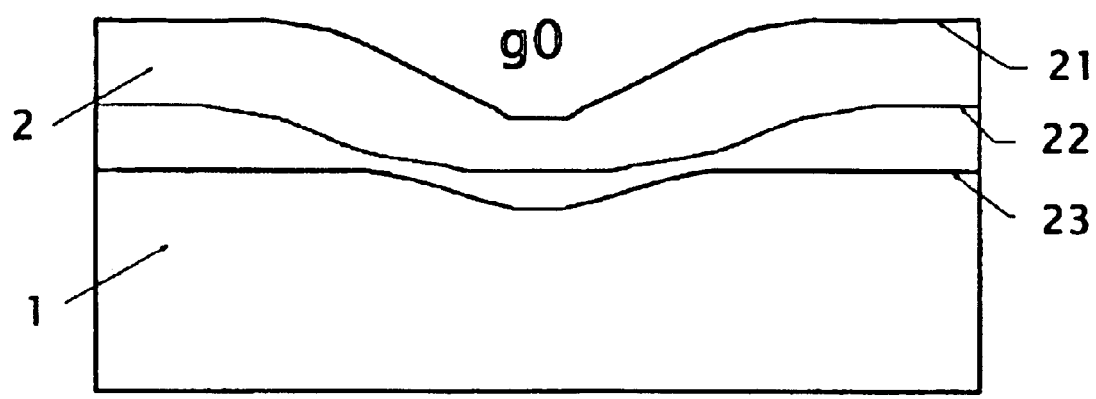
FIG. 3 is a cross-sectional view of a groove formed in predetermined depth under the manufacturing process shown in FIGS. 2 (a) through (e).
Figure 4:
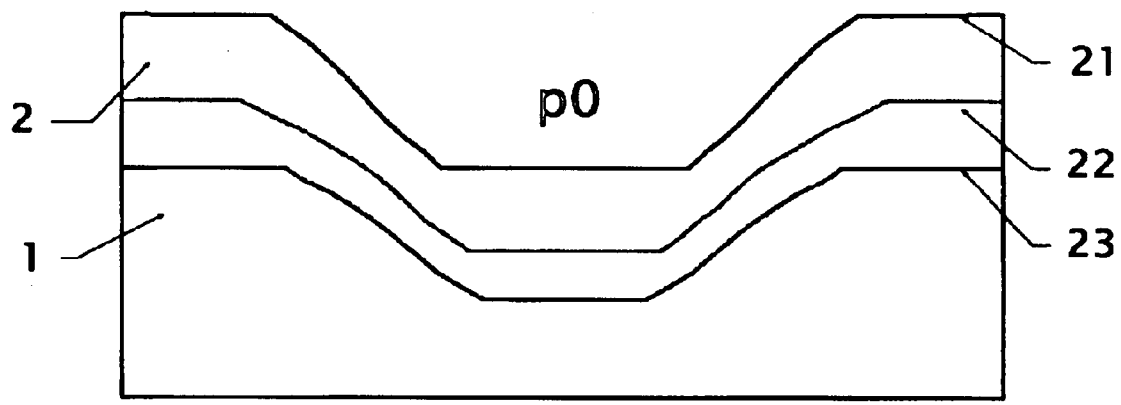
FIG. 4 is a cross-sectional view of a pit formed in predetermined depth under the manufacturing process shown in FIGS. 2 (a) through (e).

FIGS. 2 (a) through 2 (e) are cross-sectional view of a disk substrate for explaining a manufacturing process according to the related art. FIG. 3 is a cross-sectional view of a disk substrate having a groove with predetermined depth, and FIG. 4 is a cross-sectional view of a disk substrate having a pit with predetermined depth.

The disk substrate is formed with a pit "p0" having a first height h1 in a pit area contiguous to the end portion of lead-in area at the inner circumference side of the disk substrate, and is formed with a groove "g0" having a second height h2 in data area subsequent to the lead-in area in concentric circle or spirally in the disk substrate. The manufacturing process of the disk substrate is described in 5 steps shown as FIGS. 2 (a) through (e).

In FIG. 2 (a), the disk substrate is composed of a resist layer (or a photoresist layer) 2a and a glass substrate such as a quartz glass 1a. The quartz glass 1a is whetted by Cerium Oxide and applied with an adhesive by vaporizing process, then the resist layer 2a is applied to the quartz glass 1a with a thickness "r" and baked. The surface of the resist layer 2a is exposed by a cutting laser to form a pit "p0" and a groove "g0" after photofinishing. The depth of the pit "p0" reaches the surface of the quartz glass 1a while the groove "g0" is half cut.

FIG. 2 (b) shows the etching of the pit "p0" formed by the step shown in FIG. 2 (a) in $CF_4$ atmosphere.

FIG. 2 (c) shows the ashing of the resist layer 2a in $O_2$ atmosphere until the thickness of the resist layer 2a becomes "rh" (r>rh) and the groove "g0" reaches the surface of the quartz glass 1a.

FIG. 2 (d) shows the second etching of the pit "p0" and the groove "g0" in $CF_4$ atmosphere forming the pit "p0" having a first depth "h1" and the groove "g0" having a second depth "h2".

FIG. 2 (e) shows removal of remaining resist layer 2a by ashing in $O_2$ atmosphere.

FIG. 3 is a cross-sectional view of a groove formed in predetermined depth step-by-step under the manufacturing process shown in FIGS. 2 (a) through (e), and FIG. 4 is a cross-sectional view of a pit formed in predetermined depth step-by-step under the manufacturing process shown in FIGS. 2 (a) through (e) In both FIGS. 3 and 4, a surface 21 is the surface of the resist layer 2a shown in FIG. 2 (a), a surface 22 is the surface of the resist layer 2a shown in FIG. 2 (c), and a surface 23 is the surface of the quartz glass 1a shown in FIG. 2 (e).

Eventually, the pit "p0" having the first depth "h1" is formed in the pit area contiguous to the end portion of the lead-in area in the inner circumference portion of the disk substrate, and the groove having the second depth "h2" (h1>h2) is formed in concentric circle or spirally in the data area subsequent to the lead-in area of the disk substrate.

In FIG. 2 (c), the ashing of the resist layer 2a exposes the orifice portion "p01" and the bottom portion "p02". As the manufacturing process proceeds to second etching shown in FIG. 2 (d), the orifice portion "p01" is formed in a step-shaped block-rectangular, which is not smooth.

Figure 2A:
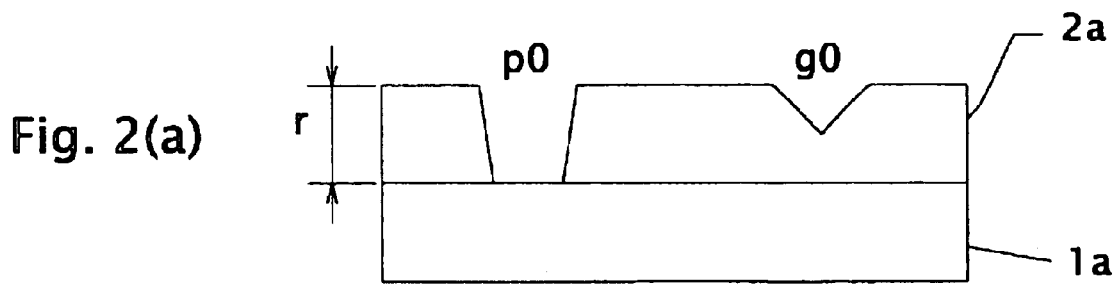
FIGS. 2 (a) through (e) are cross-sectional views for explaining a manufacturing process of a disk substrate according to the prior art.
Figure 2B:
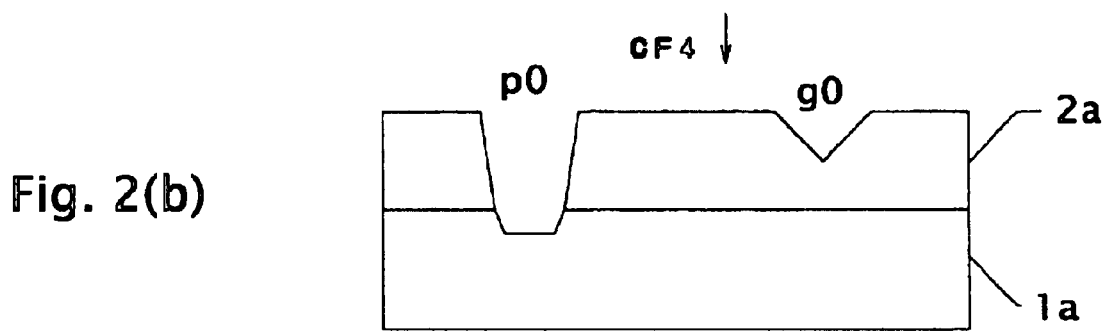
Figure 2C:
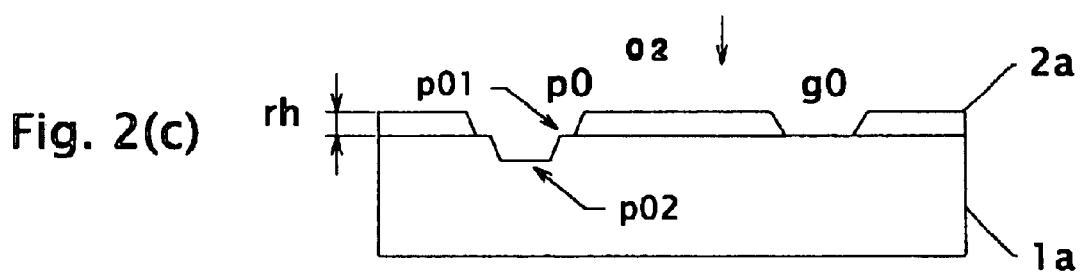
Figure 2D:
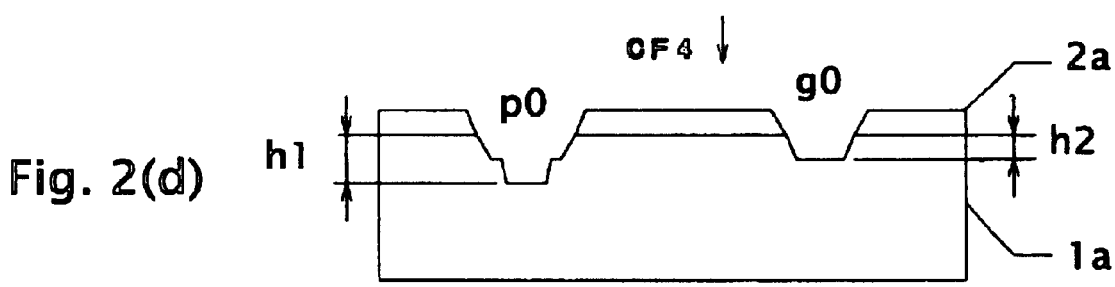
Figure 2E:
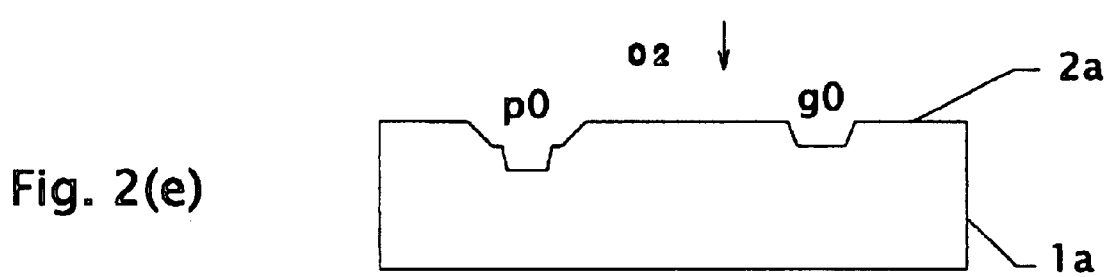

The disk substrate manufactured by the process described above provides the disk substrate as shown in FIG. 2(e) which is used for an original disk substrate to make a disk stamper for mass production of an optical disk. For example, a transparent plastic disk plate is molded by such a disk stamper manufactured from the disk substrate, then a first dielectric layer, an intermediate layer, a recording layer, a second dielectric layer, a reflection layer and a protection layer are build-up onto such the disk plate to form a phase change optical disk.

However, an optical disk formed by such a disk stamper may have a pit jitter element caused by varied shape (step-shaped as described above) of the pit in long direction formed in the disk substrate.

If the optical disk having the pit jitter element is reproduced by an optical disk player, a reproducing operation can not be synchronized with a reproducing clock so that the optical disk can not be reproduced. Accordingly, the pit jitter element should be minimized in the disk substrate during the manufacturing processes.

The present invention provides a manufacturing method for a disk substrate to obtain a pit having smooth shape of an orifice portion in a quartz glass substrate.

The disk substrate in accordance with the present invention applies to the DVD-RW. The disk substrate is provided with a pit "p1" having a first depth h1 in the pit area (which area is also indicated as "Readable Emboss" as shown in FIG. 1) contiguous to the end portion in the lead-in area at the inner circumference of the disk substrate, and with a groove "g1" having a second depth h2(h1>h2) in the data area subsequent to the lead-in area in concentric circles or spirally.

As described below, the disk substrate according to the present invention includes a disk master having 240 mm diameter and having binary depth of pit and/or groove on a quartz glass, and a disk plate duplicated by molding a transparent resin with a disk stamper formed by the disk master.

Figure 5A:
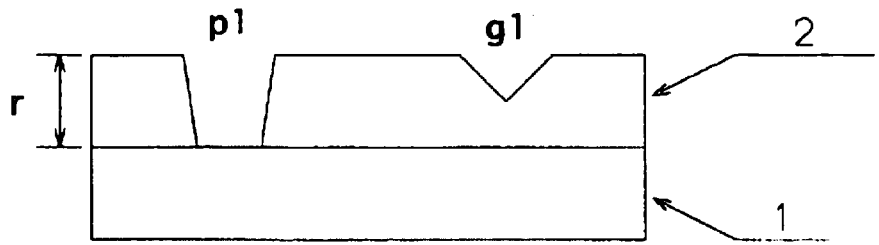
FIGS. 5 (a) through (e) are cross-sectional views of a disk substrate according to an embodiment of the present invention.
Figure 5B:
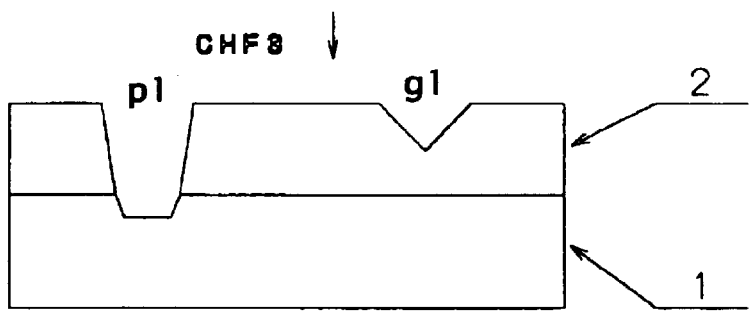
Figure 5C:
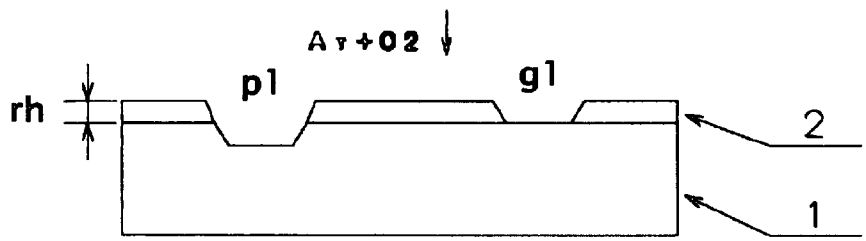
Figure 5D:
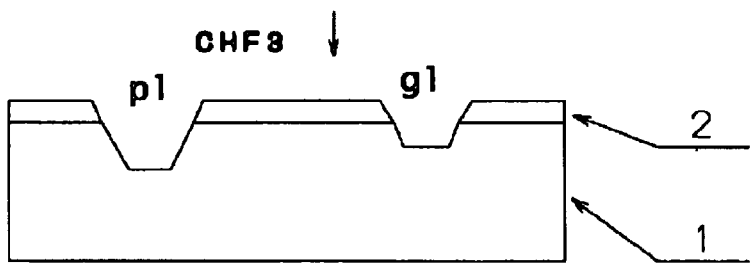
Figure 5E:
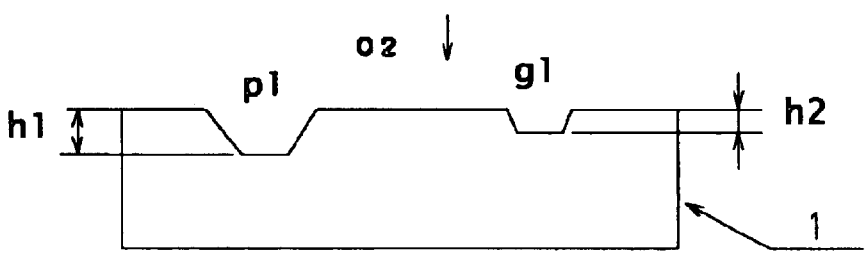

FIGS. 5(a) through (e) are cross-sectional views of a disk substrate according to an embodiment of the present invention. In FIG. 5(a), a disk substrate is composed of a resist layer 2 and a glass substrate such as a quartz glass 1. A quartz glass 1 is coated by Cerium Oxide and applied with an adhesive by vaporizing process, then a resist layer 2 is coated on the quartz glass 1 with a thickness "r" and baked. The surface of the resist layer 2 is exposed by a cutting laser to form a pit "p1" and a groove "g1".

FIG. 5 (b) shows the etching of the pit "p1" formed by the step shown in FIG. 5 (a) in $CHF_3$ atmosphere.

FIG. 5 (c) shows the ashing of the resist layer 2 in $O_2$ atmosphere mixed with Argon (Ar) in predetermined mixing ratio until the groove "g1" reaches the surface of the quartz glass 1. The mixing ratio of Oxygen and Argon gas Ar/(Ar+O$_2$) is 5 to 90% in volume, and preferably 10 to 90%.

FIG. 5 (d) shows the second etching of the pit "p1" and the groove "g1" in CHF$_3$ atmosphere.

FIG. 5 (e) shows removal of remaining resist layer 2 in O$_2$ atmosphere and forming the pit "p1" having a first depth "h1" and the groove "g1" having a second depth "h2". Then, the disk substrate can be obtained finally.

In the first step of manufacturing process shown in FIG. 5 (a), the difference of the depth of the pit and the groove is provided within the range of 30 to 60 nm.

In the third step of manufacturing process shown in FIG. 5 (c), where ashing is conducted on a half cut portion of the resist pattern formed in the surface of photoresist layer on the quartz glass by Oxygen, the condition of gas pressure is 0.1 to 2.0 Pa, or preferably 0.5 to 1.5 Pa, and the ashing power is 0.1 to 0.25 w/cm$^2$. In addition, the direction of ashing is stronger vertically than horizontally (in other words, the ashing is having an anisotropy) and the resist pattern will not deform by heat. Further, the ashing is conducted on the half cut portion with Argon gas admixed in the Oxygen in the volume ratio of Ar/(Ar+O$_2$) 5 to 90%, preferably 10 to 90%.

Figure 6:
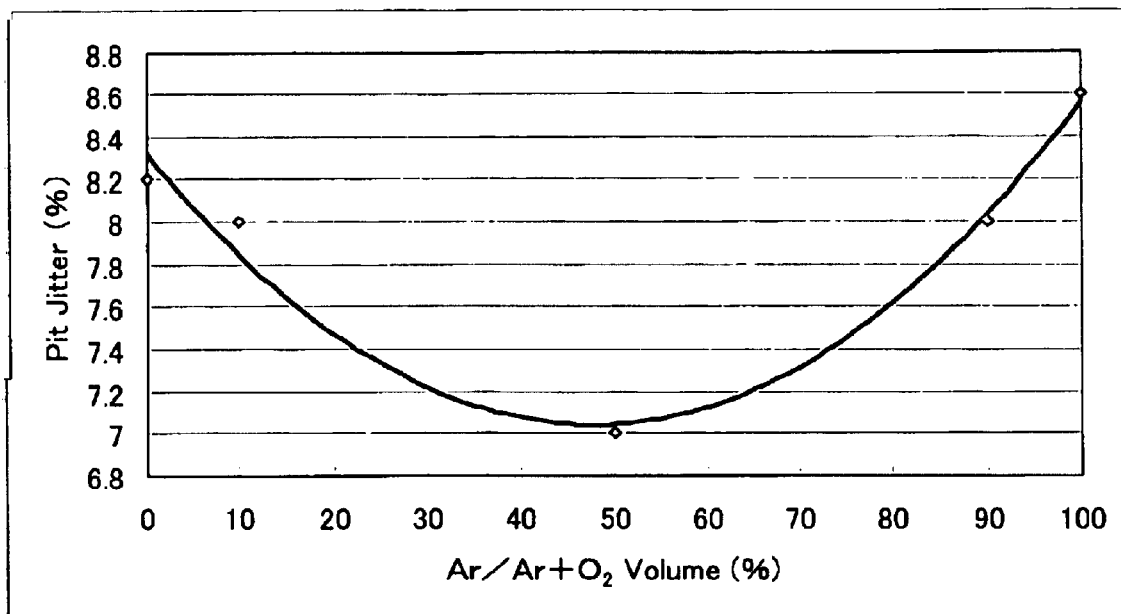
FIG. 6 is a diagram showing a volume of $Ar/Ar+O_2$ gas and a pit jitter characteristic of a disk substrate under a manufacturing process according to the present invention.

FIG. 6 is a diagram showing a volume of Ar/Ar+O$_2$ gas and a pit jitter characteristic of a disk substrate under a manufacturing process according to the present invention. As shown in FIG. 6, the amount of Argon gas admixed in Oxygen provides improved pit jitter characteristic. When mixing an inert gas of Argon in lower gas pressure such as 0.1 to 2.0 Pa, an Ar Ion in the excitation state by plasma will linearly hits a cathode so that the anisotropy increases.

In the meantime, the difference of the depth of the pit (completely exposed portion) and the groove (half cut portion) after photofinishing is in the range of 30 nm to 60 nm.

In the third manufacturing step, an RIE (Reactive Ion Etching) is adopted for ashing, but NLD (Neutral Loop Diskharge) or ICP which independently controls plasma can be used for anisotropic ashing.

In the fourth manufacturing step, the etching of the quartz glass which surface exposed will be carried out under low pressure 0.1 to 3 Pa of CHF$_3$ gas, with a power less than 0.44 to 0.66 W/cm$^2$.

The resist layer 2 to be put on the quartz glass 1 should not be deformed even when the temperature rises over 110 to 130° C. The thickness of the quartz glass 1 is in the range of 1 mm to 6 mm. This range is preferably set for cooling efficiency of a cathode, and for having anisotropic structure. Otherwise, the thickness of layer will be thinner and the orifice portion of the pit may become wider in the first ashing process.

A photoresist layer 2 or the resist layer 2 to be applied on the quartz glass 1 will be exposed to heat during the first etching (the second process) and the first ashing (the third process). The heat may deform the resist pattern so that the resist layer should resist heat as well.

For example, such the resist layer is composed of Novolac resin which solvent is an Ethyl-cellosolve-acetate.

The difference between the pit and the groove fully exposed after photofinishing should be in the range of 30 to 60 nm for the cutting in the first process described above, or otherwise the resist layer is damaged so that the desirable resist pattern can not be obtained after the first etching in CHF$_3$.

The first and second etching of the quartz glass for the second and fourth process is conducted by using CHF$_3$ gas, which relatively makes the etching pattern in block-rectangular shape, under the pressure of 0.1 to 3 Pa, and the power of 0.44 to 0.66 W/cm$^2$.

The first ashing in the third process should be conducted by using power that will not make the heat deformation of the resist pattern, and not to have the layer thickness bigger and not to have the orifice portion become wider. The condition is that the volume mixing ratio of Ar/(Ar+O$_2$) is 10 to 90% and the gas pressure less than 2 Pa with the power less than 0.25 W/cm$^2$. The second etching in the fifth process is conducted under the same condition as the first etching but so that the etching is conducted for the predetermined groove depth. The second (last) ashing is for cleaning the resist layer so the gas pressure can be more than 7 Pa with the power more than 0.22 W/cm$^2$.

The manufacturing process described above can be summarized as follows.

(1) In order to avoid heat deformation of a resist pattern, the first ashing is preferably conducted with the quartz glass having the thickness of 1 mm to 6 mm which has high cooling efficiency of a cathode. The gas for ashing should be mixed with Oxygen and Argon (as an inert gas) in a volume mixing ratio of Ar/(Ar+O$_2$) of 10 to 90% so that the anisotropy of the ashing increases. The condition of ashing should be below 2 Pa in gas pressure with the power less than 0.25 W/cm$^2$.

(2) A material for the resist layer to be applied to the quartz glass resist heat which prevents deformation of the resist pattern under the first etching and first ashing. For example, the material for the resist layer is composed of Novolac resin which solvent is Ethyl-cellosolve-acetate.

(3) The difference of the pit and the groove fully exposed after photofinishing should be more than 30 nm or otherwise the resist layer is damaged by the first etching and desirable shape of the groove can not be obtained.

(4) CHF$_3$ gas will be used for etching the quartz glass with the gas pressure less than 3 Pa with the power more than 0.44 W/cm$^2$ so that the quartz glass becomes block-rectangular shape.

As shown in FIGS. 1 and 2 (a) through 2 (e), a pit "p1" having a first depth h1 is formed in a pit area contiguous to the end portion of lead-in area in the inner circumference of disk substrate, and a groove "g1" having a second depth h2(h1>h2) is formed in a data area subsequent to the lead-in area in concentric circles or spiral shape on the disk substrate. The disk substrate is manufactured by following processes.

(1) As shown in FIG. 5(a), a disk substrate having a diameter of 240 mm and a thickness of 6 mm made of quartz glass 1 is coated with Cerium Oxide and vaporized with hexamethyldisilazane ((CH$_3$)$_3$SiNHSi(CH$_3$)$_3$) as an adhesive. Then a photoresist called "TSMRV3" (a product of Tokyo Ohka Kogyo Ltd.) is applied to the quartz glass 1 with a thickness of 100 nm, and baked for 40 minutes in 90° C. A cutting laser is exposed to the surface of the resist layer 2 and a pit "p1" and a groove "g1" are obtained. The pit "p1" is cut deeper than the groove "g1" that the surface of quartz glass 1 is exposed while the groove "g1" is half cut in the resist layer. The cutting of the pit and the groove applies to the DVD-RW format ver. 1.1. The depth h1 of the pit "p1" is 100 nm and the depth of the groove "g1" is 70 nm which difference is 30 nm.

(2) As shown in FIG. 5 (b), the first etching is conducted to the pit "p1" in CHF$_3$ atmosphere, under the gas pressure 3 Pa with the power 200 W. The depth of the pit "p1" becomes 70 nm from the surface of the resist layer 2.

Figure 7:
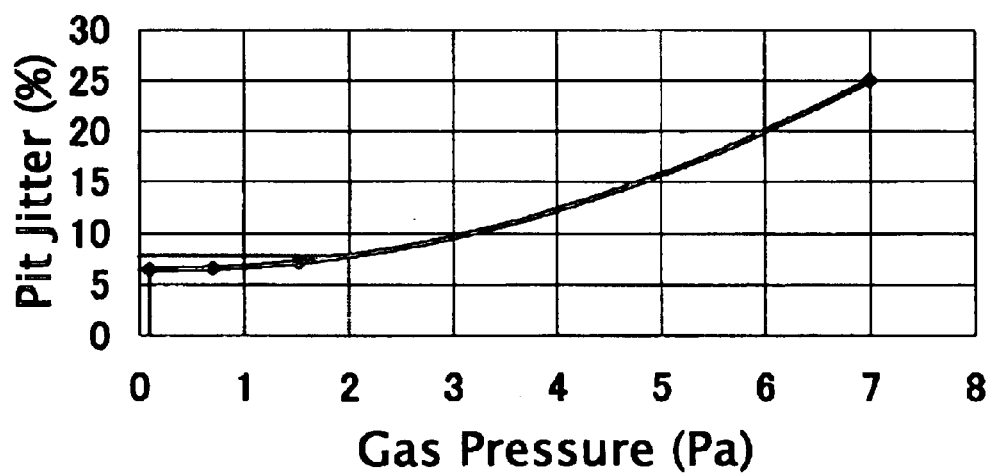
FIG. 7 is a diagram showing a gas pressure and a pit jitter characteristic of a disk substrate under a manufacturing process according to the present invention.

(3) As shown in FIG. 5 (c), the ashing is conducted to the groove "g1" in Ar+$O_2$ atmosphere until the depth of the groove "g1" reaches the surface of the quartz glass 1. The thickness of the resist layer 2 is "rh" (r>rh). The first ashing is conducted in Ar+$O_2$ atmosphere to make the anisotropy. The flow rate of Argon is 5 sccm, and the flow rate of the oxygen is 5 sccm, and vacuum rate is 1.5 Pa in gas pressure and 100 W in power. The value of pit jitter element is in good condition in 0.1 to 1.5 Pa as shown in FIG. 7. The thickness "rh" of the resist layer 2 is decreased to 40 nm from 100 nm. The bottom of the groove "g1" reaches the surface of the quartz glass 1. The anisotropic ashing is conducted to prevent the resist layer from ashing the orifice portion of the pit "p1". The thickness of the resist layer and the orifice portion of the pit is measured by AFM (Atomic Force Microscope).

(4) As shown in FIG. 5 (d), the second etching in the $CHF_3$ atmosphere will form the depth of the pit "h1" to 100 nm and the depth of the groove "h2" to 30 nm. The etching is conducted for the depth of 25 nm under gas pressure 3 Pa and the power of 200 W.

(5) As shown in FIG. 5 (e), the resist layer 2 will be cleaned completely by ashing for 5 minutes with the power 100 W in oxygen atmosphere.

As a result, the pit "p1" having the first depth h1 is formed in the pit area contiguous to the end portion of the lead-in area at inner circumference of the disk substrate, Further, the groove "g1" having the second depth h2 (h1>h2) is formed in the data area subsequent to the lead-in area, in concentric circles or a spiral, of the disk substrate.

FIG. 7 is a diagram showing a gas pressure and a pit jitter characteristic of a disk substrate under a manufacturing process according to the present invention.

Figure 8:
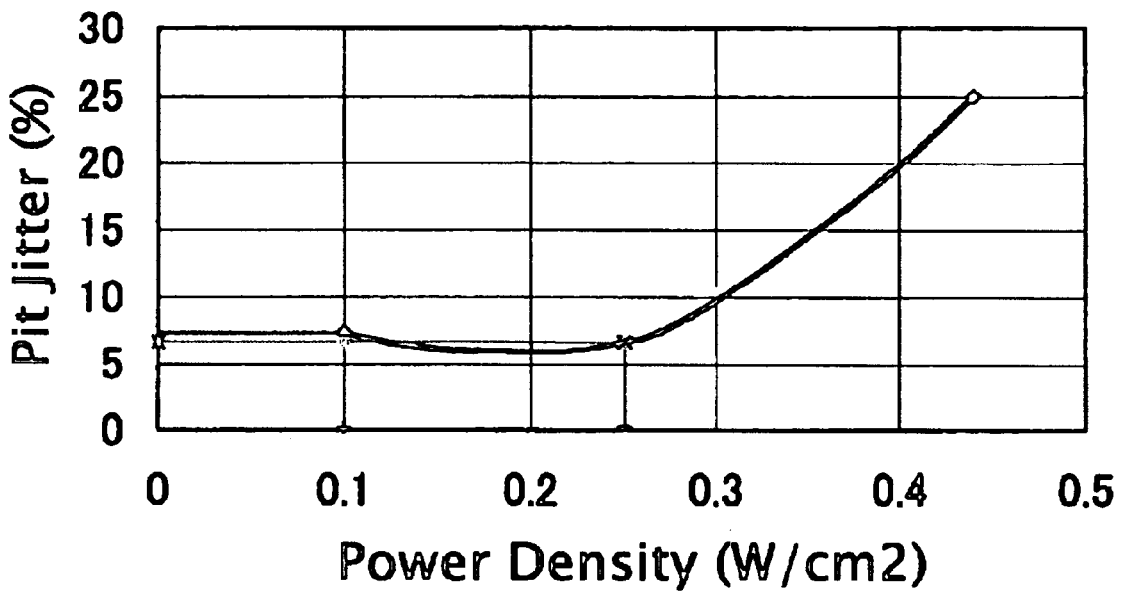
FIG. 8 is a diagram showing a power intensity and a pit jitter characteristic of a disk substrate under the manufacturing process according to the present invention.

FIG. 8 is a diagram showing a power intensity and a pit jitter characteristic of a disk substrate under the manufacturing process according to the present invention.

By adopting the manufacturing processes shown in FIGS. 5 (a) through (e), the gas pressure and the pit jitter characteristic can be shown as FIG. 7. In FIG. 7, the pit jitter can be suppressed for 6–7% when the gas pressure is in the range of 0.1 to 1.5 Pa.

Under the gas pressure, the quartz glass 1 having 240 mm diameter for the disk master is conducted with ashing by the power of 100 W, which power density is 0.221 W/$cm^2$. However, FIG. 8 also shows that pit jitter is decreased to 6–7% in the range of 0.1 to 0.25 W/$cm^2$ including the power density of 0.221 W/$cm^2$.

Figure 9:
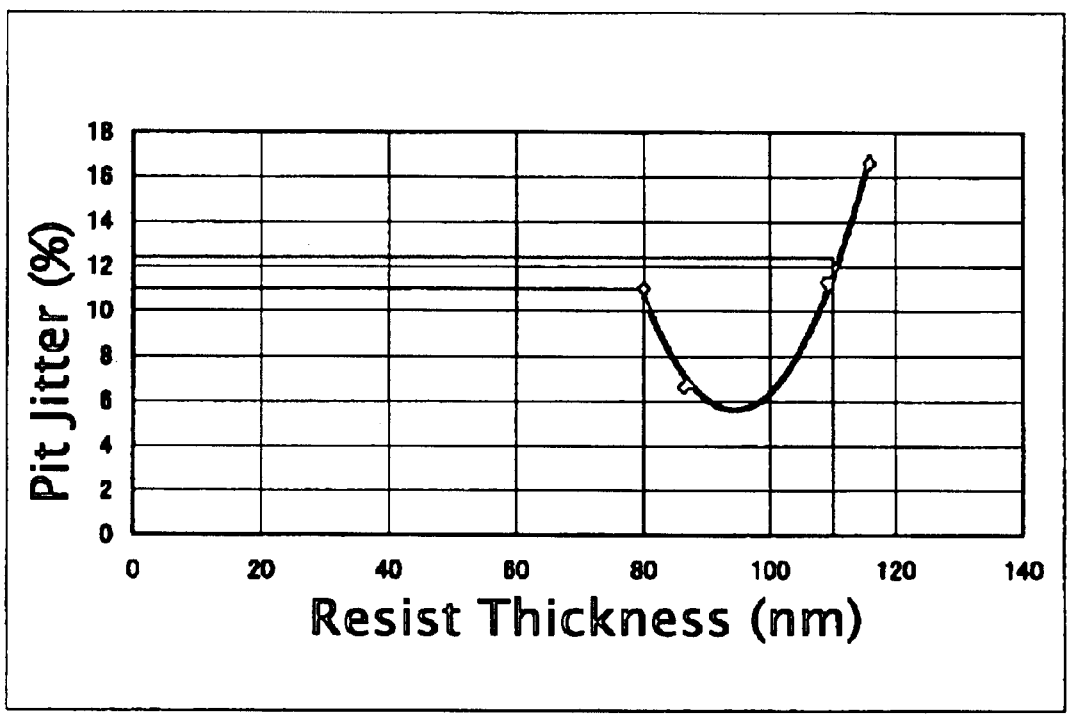
FIG. 9 is a diagram showing a resister thickness and a pit jitter characteristics of a disk substrate under the manufacturing process according to the present invention.

Further, the resist layer thickness and pit jitter characteristics will be shown as FIG. 9 that the pit jitter can be suppressed to 6 to 12% when the resist layer thickness is in the range of 80 to 110 nm. In this connection, the groove jitter is 7% or less for each case indicated above.

The disk substrate having binary depth of pit and/or groove is formed in 240 mm diameter quartz glass, and is manufactured by the processes described above will be used as a disk master and will be used for manufacturing a disk stamper. The disk stamper will be used for molding transparent plastic disk plates. The disk plate is build-up with a first dielectric layer, an intermediate layer, a recording layer, a second dielectric layer, a reflection layer and a protection layer to construct a phase change optical disk. As the pit jitter element is suppressed by the manufacturing processes of the disk substrate described above, a varied shape of the pit can be suppressed in the disk plate formed by a disk stamper manufactured by the disk substrate. Accordingly, an optical disk manufactured by accumulating various layers on the disk plate as described above, can properly be reproduced by an optical disk player.

More specifically, the disk stamper is formed by Nickel electrotyping, and centering the disk master manufactured from the disk substrate having block-rectangular shaped pit and groove which pit has the depth of 95 nm and groove has the depth of 25 nm. In addition, a plurality of disk stampers can be duplicated from the quartz glass master.

The disk stamper is used as a casting mold for manufacturing a large quantity of transparent plastic disk substrates.

Figure 10:
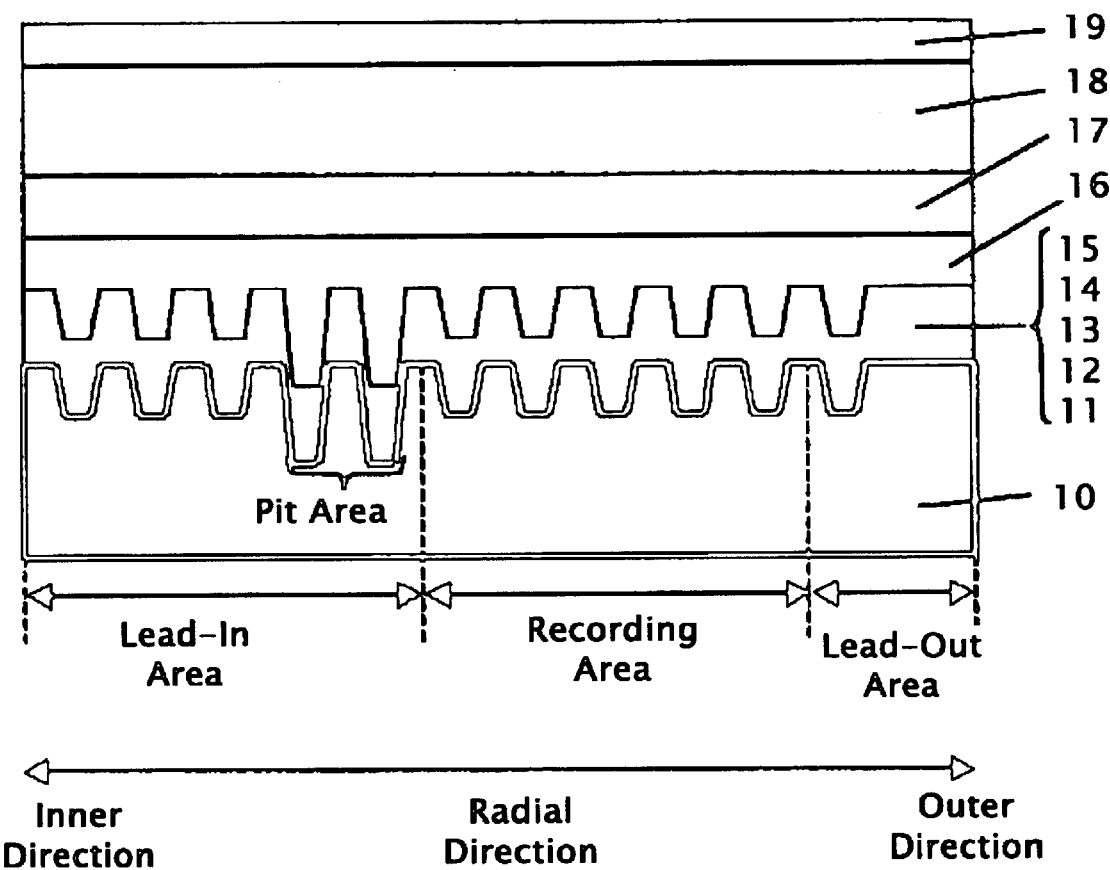
FIG. 10 is a cross-sectional view of a disk for explaining the structure of the disk according to the present invention.

FIG. 10 is a cross-sectional view of a disk manufactured by the process described above. In FIG. 10, a disk substrate 10 has a diameter of 120 mm and a thickness of 0.6 mm and made of polycarbonate substance with a dielectric layer 11 composed of ZnS—$SiO_2$, an intermediate 12 composed of GeN, a phase change recording layer 13 composed of AgInSbTe, a dielectric layer 14 composed of ZnS—$SiO_2$, a reflection layer 15 composed of AlTi, an UV (ultra violet wave) coating layer 16, a sticking sheet 17, a polycarbonate protection substrate 18 and a print layer 19 build-up to form a phase change optical disk such as a DVD-RW disk.

As described above, the present invention provides a manufacturing process of a disk substrate made of quartz glass having a pit with a first depth at the portion of the inner circumference of the disk substrate, and having a groove with a second depth at the portion of the outer circumference of the disk substrate. Particularly, in various steps of the manufacturing process, the ashing in the third step of the manufacturing process is conducted in an atmosphere of gas mixed by Argon and Oxygen with the mixture ratio of Ar/(Ar+$O_2$) is 10 to 90% and the gas pressure is 0.1 to 1.5 Pa.

Accordingly, the photoresist layer will have an anisotropy in ashing process that the orifice of the pit will not grind out even when the thickness of the photoresist layer decreases.

Eventually, the inside wall of the pit for the disk substrate can be obtained in a smooth block-rectangular shape. Consequently, the disk substrate is used for making a disk stamper to manufacture disk substrates for phase change optical disks. The disk substrate is build-up with various layers such as the first dielectric layer, the intermediate layer, the recording layer, the second dielectric layer, the reflection layer and protection layer. As the inside wall of the pit of the disk substrate is formed smoothly, the pit jitter element as described above can be suppressed for the optical disk manufactured by the disk stamper formed by such the disk substrate that the optical disk can be reproduced properly by the optical disk player.

Further, various administrative information is recorded in the pit area of the disk such as information concerning an appropriate laser power, and/or copyright such as CPRM (Content Protection for Recordable Media) can be reproduced properly without any jitter element.

While the invention has been described above with reference to the specific embodiment thereof, it is apparent that many changes, modifications and variations in the arrangement of equipment and devices and in material can be made without departing from the invention concept disclosed therein. For example, it is needless to say that the administrative information is not limited to the above but also include any other information which should be recorded in the pit area.

What is claimed is:

1. A method for manufacturing a disk substrate for mass production of a phase change optical disk, wherein the disk substrate is provided with a pit and a separate groove located in an outer circumference area of the pit, the method comprising the steps of:
   coating a photoresist on a surface of a glass substrata so as to form a resist layer on the glass substrate;
   exposing the surface of the resist layer to form a first depression having a first depth and a second depression having a second depth located in an outer circumference area of the first depression, wherein the first depth reaches the surface of the glass substrate and the second depth is shallower than the first depth;
   developing the resist layer and forming the first depression and the second depression;
   etching of the glass substrate from the surface thereof to form a pit;
   ashing the resist layer in an oxygen atmosphere mixed with Argon in a volume ratio of 10 to 90% under the gas pressure of 0.1 to 1.5 Pa, where the ashing power is 0.1 to 0.25 W/cm$^2$ to reduce a thickness of the resist layer until the bottom of the second depression reaches the surface of the glass substrate;
   repeating etching of the glass substrate to deepen the depth of the pit until it reaches a predetermined depth, and to form a groove, having a predetermined depth, from the second depression; and
   repeating ashing of the resist layer in an oxygen atmosphere under the gas pressure of marc than 7 Pa to remove the remaining resist layer.

2. A method for manufacturing a disk substrate according to claim 1, wherein a difference of the depth of the first depression and the second depression is in a range of 30 nm to 60 nm.

3. A method for manufacturing a disk substrate according to claim 2, wherein the resist layer has a heat resistance between 110° C. and 130° C.

4. A method for manufacturing a disk substrate according to claim 3, wherein the etching steps are carried out in a CHF$_3$ atmosphere under the gas pressure of 0.1 to 3.0 Pa.

5. A method for manufacturing a disk substrate according to claim 1, wherein the resist layer has a heat resistance between 110° C. and 130° C.

6. A method for manufacturing a disk substrate according to claim 5, wherein the etching steps are carried out in a CHF$_3$ atmosphere under the gas pressure of 0.1 to 3.0 Pa.

7. A method for manufacturing a disk substrate according to claim 1, wherein the etching steps are carried out in a CHF$_3$ atmosphere under the gas pressure of 0.1 to 3.0 Pa.

8. A method for manufacturing a disk substrate according to claim 1, wherein the resist layer is composed of Novolac resin.

* * * * *